(12) United States Patent
Sun

(10) Patent No.: US 7,727,007 B2
(45) Date of Patent: Jun. 1, 2010

(54) MOUNTING APPARATUS FOR BATTERY

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/344,260

(22) Filed: Dec. 25, 2008

(65) Prior Publication Data
US 2010/0059644 A1 Mar. 11, 2010

(30) Foreign Application Priority Data
Sep. 8, 2008 (CN) .................... 2008 1 0304418

(51) Int. Cl.
*H01R 3/00* (2006.01)

(52) U.S. Cl. ................................ 439/500

(58) Field of Classification Search ............. 439/500, 439/135; 429/100, 96; 361/679.02
See application file for complete search history.

(56) References Cited

U.S. PATENT DOCUMENTS

| 3,519,977 | A | * | 7/1970 | Swearingen | ............... 439/135 |
| 5,594,617 | A | * | 1/1997 | Foster et al. | ........... 361/679.02 |
| 5,714,716 | A | * | 2/1998 | Yamada | ...................... 174/542 |
| 5,876,241 | A | * | 3/1999 | Frantz | ........................ 439/500 |
| 6,006,130 | A | * | 12/1999 | Higo et al. | .................... 604/20 |
| 6,722,916 | B2 | * | 4/2004 | Buccinna et al. | ............ 439/500 |
| 2009/0181574 | A1 | * | 7/2009 | Wu | ............................. 439/500 |

* cited by examiner

*Primary Examiner*—T C Patel
*Assistant Examiner*—Phuong Nguyen
(74) *Attorney, Agent, or Firm*—Zhigang Ma

(57) ABSTRACT

A mounting apparatus for mounting a battery includes a base and a bracket. The bracket is configured for receiving the battery. The bracket is rotatably mounted to the base.

13 Claims, 5 Drawing Sheets

Figure 1:
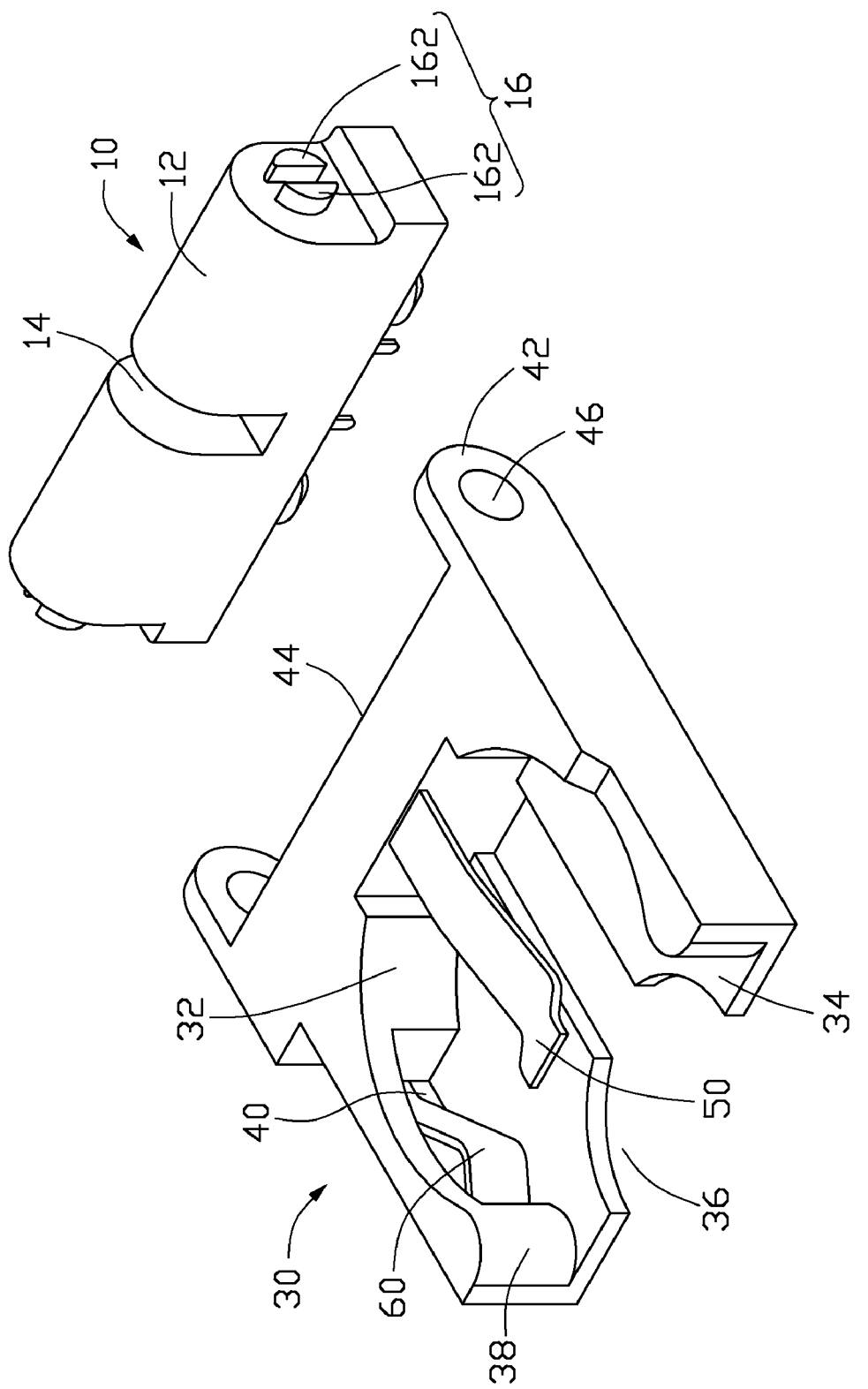
Figure 2:
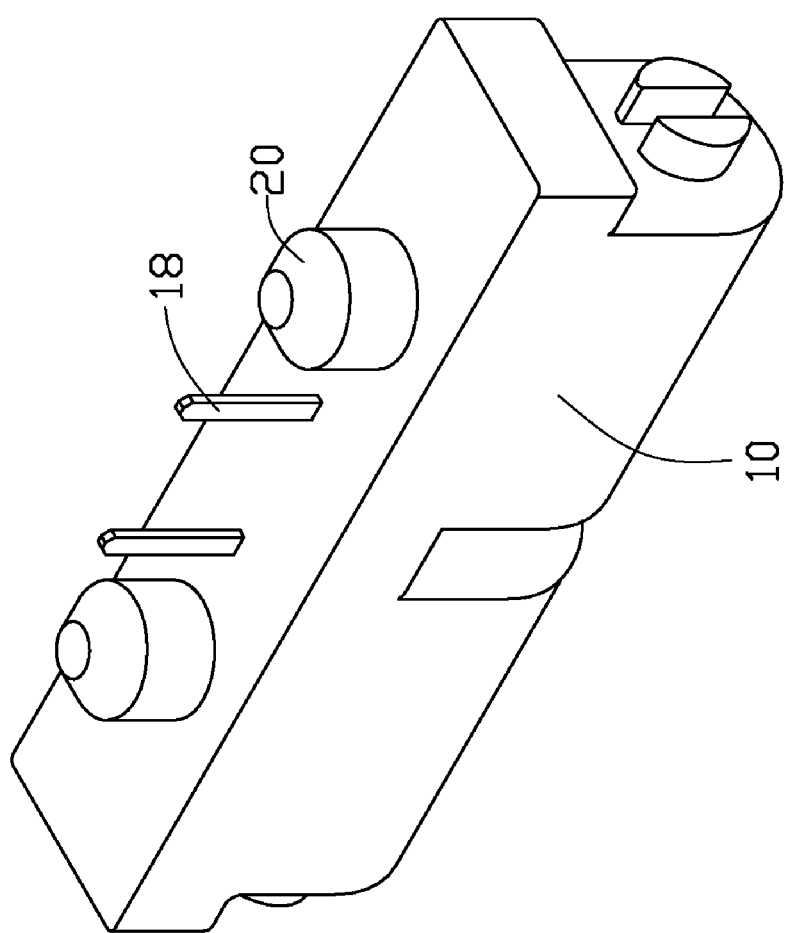
Figure 3:
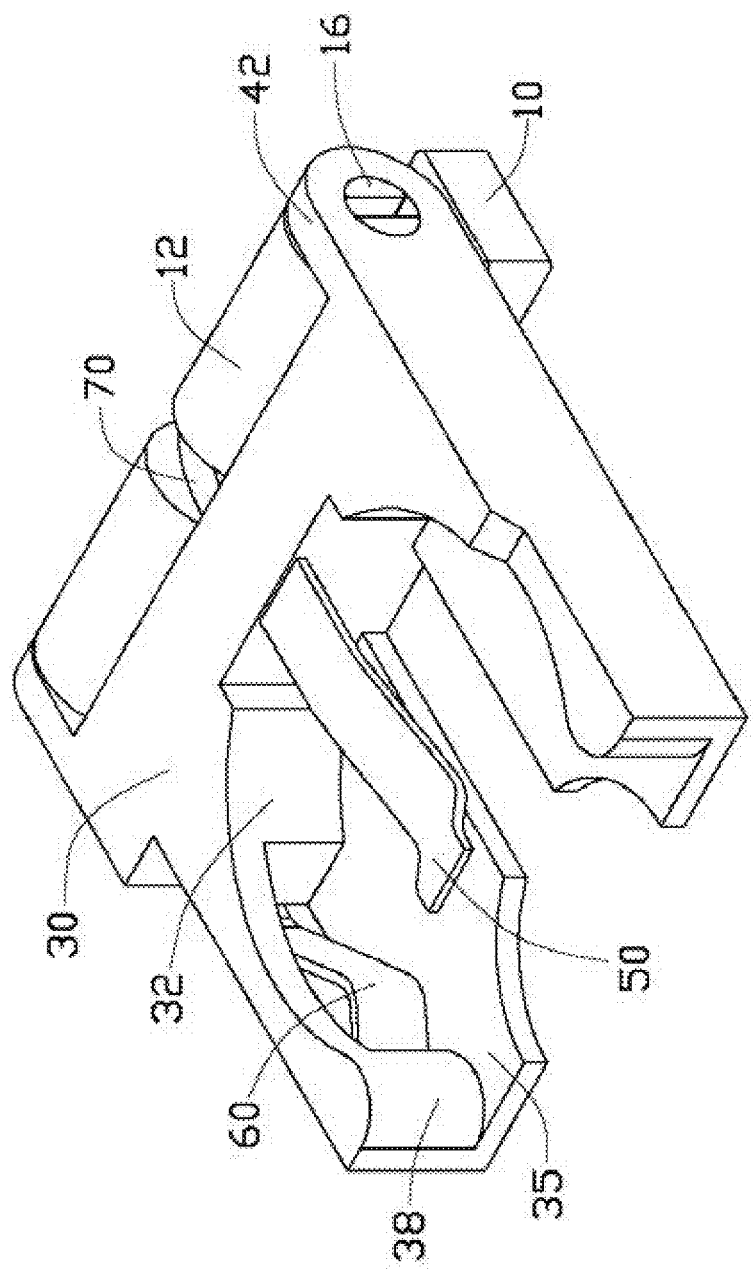
Figure 4:
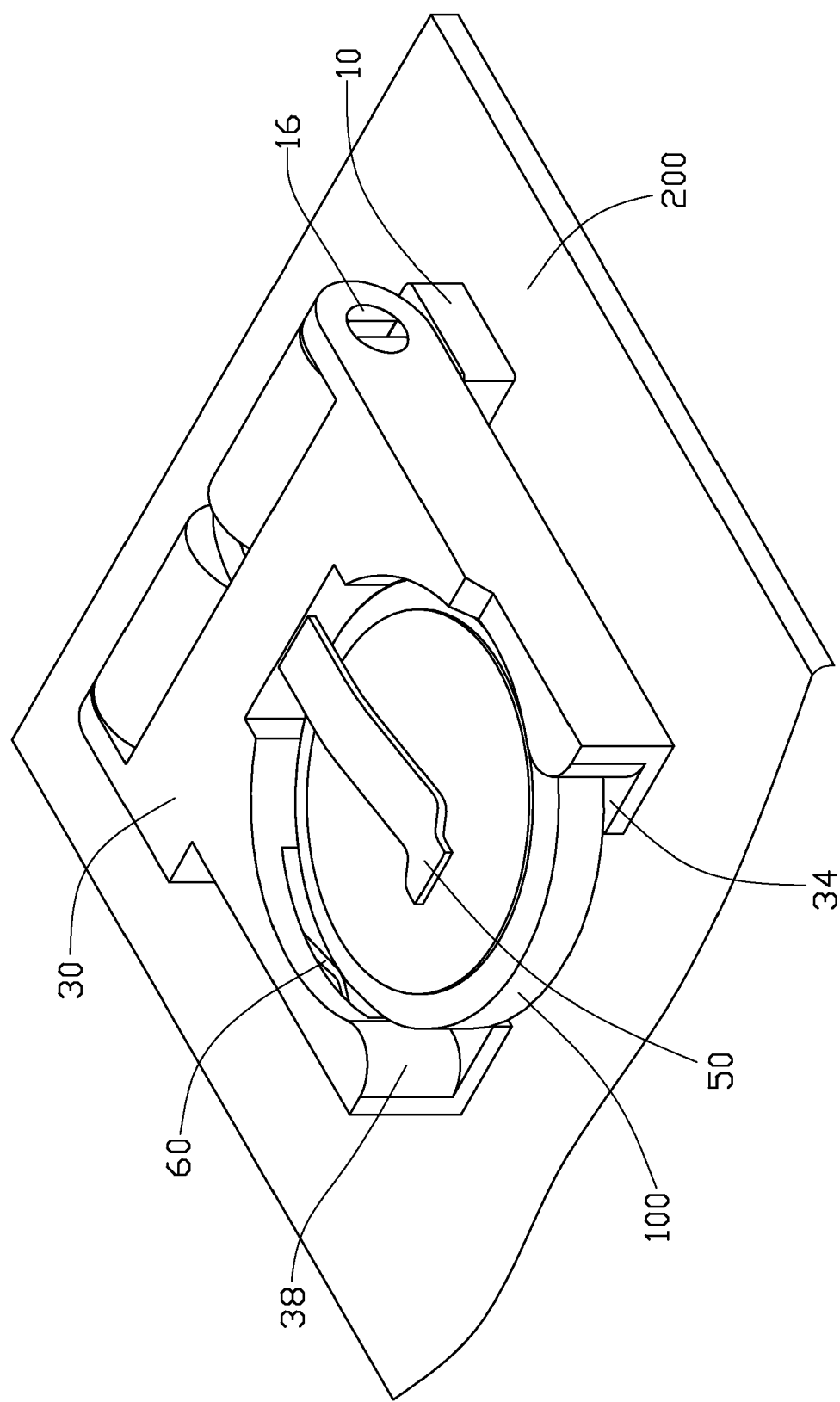
Figure 5:
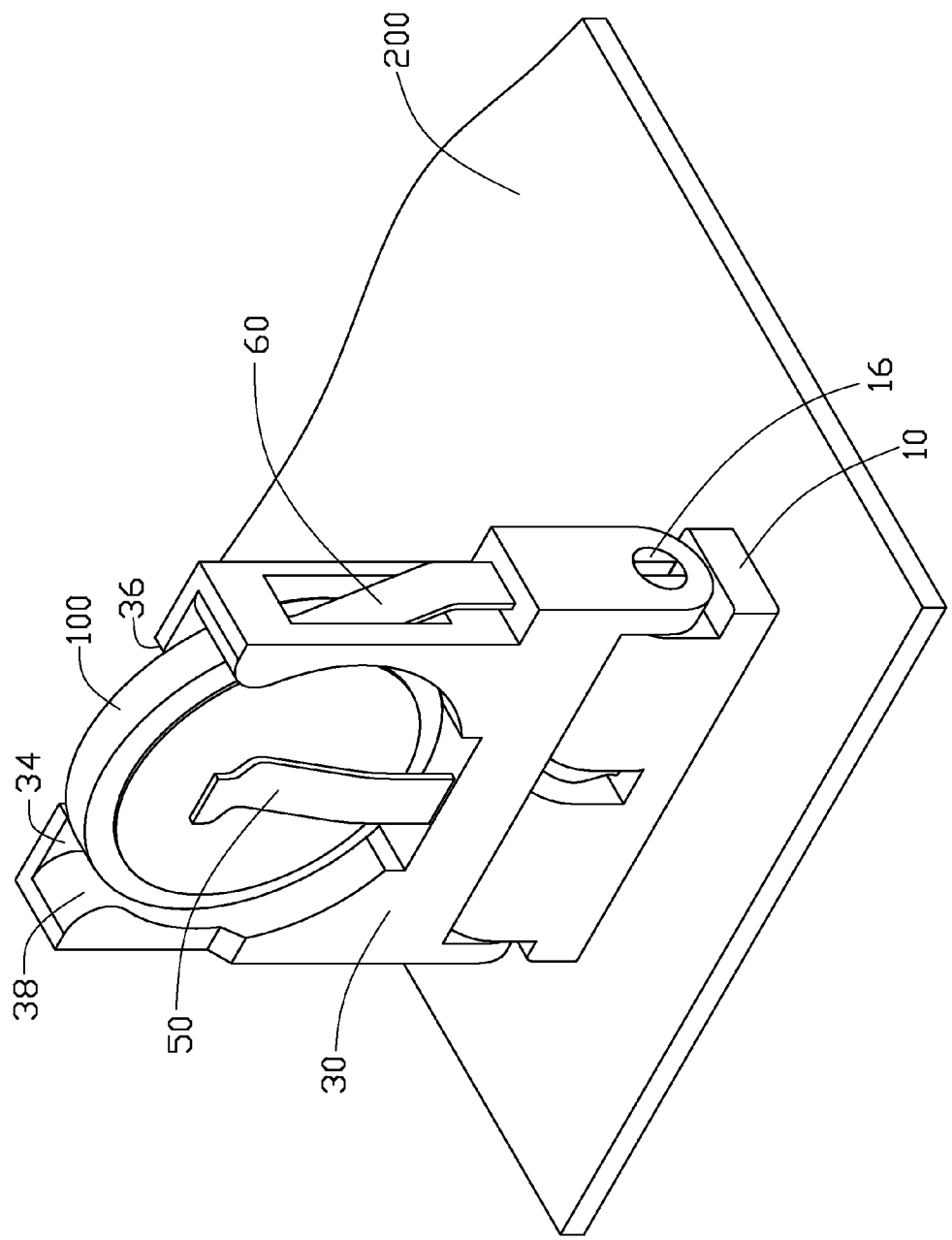

MOUNTING APPARATUS FOR BATTERY

BACKGROUND

1. Technical Field

The present disclosure relates to mounting apparatuses and, more particularly, to a mounting apparatus for mounting a battery.

2. Description of Related Art

Generally speaking, a printed circuit board (PCB) of a computer system includes a battery holder fixed thereon for mounting a battery, such as a button cell battery to supply power for a basic input output system (BIOS) of the computer system after the computer system is shutdown. Therefore, the BIOS can keep time even though the computer system is shutdown.

Currently, battery holders maintain batteries fixedly to the PCB, either parallel or vertical, which limits options in the layout of the PCB.

What is desired, therefore, is an apparatus for mounting a battery which overcomes the above-mentioned shortcoming.

BRIEF DESCRIPTION OF THE DRAWINGS

FIG. 1 is an exploded, isometric view of an exemplary embodiment of a mounting apparatus for a battery, the mounting apparatus including a base.

FIG. 2 is an enlarged, inverted view of the base of FIG. 1.

FIG. 3 is an assembled view of the mounting apparatus of FIG. 1.

FIG. 4 is similar to FIG. 1, but showing a first state of the mounting apparatus mounting a battery.

FIG. 5 is similar to FIG. 4, but showing a second state of the mounting apparatus mounting the battery.

DETAILED DESCRIPTION

Referring to FIGS. 1 to 4, an exemplary embodiment of a mounting apparatus for mounting a battery 100, such as a button cell battery hereinafter in this embodiment referred to as a cell 100, to a printed circuit board (PCB) 200 includes a base 10 and a bracket 30 rotatably mounted to the base 10.

The base 10 includes a flat portion (not labeled) and two arc-shaped protrusions 12 protruding up from a top of the flat portion. The protrusions 12 are aligned with each other, with a space 14 defined therebetween. Two electric terminals 18 protrude down from a bottom of the flat portion, corresponding to the space 14. Two posts 20 protrude down from the bottom of the flat portion, at opposite sides of the electric terminals 18. A shaft 16 protrudes from an end of each protrusion 12, opposite to the space 14. The shaft 16 includes two spaced substantially semicircular-shaped projecting parts 162.

The bracket 30 defines a generally circular receiving space 32 in a side thereof. The receiving space 32 includes a bottom wall 34. An opening 35 is defined in an end of the bracket 30, communicating with the receiving space 32, for the cell 100 passing therethrough when placed in or removed from the receiving space 32. A slot 36 is defined in the bottom wall 34, adjacent the opening 35, for receiving fingers of an operator or a tool for convenient manipulation of the cell 100. An elastic first conductive tab 50, functioning as a positive electrical contact, extends from an upper part of a sidewall bounding the receiving space 32 toward the opening 35, located at a top of the receiving space 32. Two arc-shaped limiting parts 38 protrude from the sidewall bounding the receiving space 32, at opposite sides of the opening 35. A through hole 40 is defined in the sidewall bounding the receiving space 32, between the first conductive tab 50 and one of the limiting parts 38. An arc-shaped elastic second conductive tab 60, functioning as a negative electrical contact, is mounted to an outer surface of the bracket 30 and inserted into the receiving space 32 through the through hole 40. An accommodating space 44 is defined in the bracket 30, opposite to the opening 35, with two extending tabs 42 formed at opposite ends of the accommodating space 44. A shaft hole 46 is defined in each extending tab 42, communicating with the accommodating space 44.

Referring to FIG. 3, in assembly, the protrusions 12 of the base 10 are accommodated in the accommodating space 44 of the bracket 30. The two extending tabs 42 are bent outward and the projecting parts 162 of each shaft 16 are squeezed toward each other to enter into a corresponding shaft hole 46. The shaft 16 is rotatably engaged in the corresponding shaft hole 46 after the projecting parts 162 are released. As a result, the bracket 30 is rotatably mounted to the base 10. The first and second conductive tabs 50 and 60 are electrically connected to the electric terminals 18 respectively via wires 70 passing through the space 14. And during the rotation of the bracket 30 relative to the base 10, the first and second conductive tabs 50 and 60 are always electrically connected to the two electric terminals 18 via the wires 70 respectively.

Referring to FIGS. 4 and 5, in use, the posts 20 of the are engaged in two fixing holes (not shown) defined in the PCB 200, with the electric terminals 18 electrically welded to the PCB 200. Therefore, the base 10 is mounted to the PCB 200. The cell 100 is entered into the receiving space 32 of the bracket 30 through the opening 35, sandwiched by the bottom wall 34 and the first conductive tab 50. The anode located at the top of the cell 100 is resisted against the first conductive tab 50, and the cathode located along the sidewall of the cell 100 is resisted against the second conductive tab 60, allowing that the first and second conductive tabs 50 and 60 clamp with electrical contact the anode and the cathode of the cell 100 respectively. The limiting parts 38 can prevent the cell 100 from accidentally disengaging from the bracket 30. Not only can the bracket 30 be parallel or perpendicular to the PCB 200 via the bracket 30 rotating relative to the base 10, but also because of interference fit between the shaft 16 and the shaft hole 46, the bracket 30 can be maintained at any angle relative to the base 10, to satisfy different demands of the PCB 200 layout. In other embodiments other kinds of batteries can be accommodated by adjusting the shape of the receiving space 32 and repositioning the conductive tabs 50 and 60 to correspond to the configuration of the other kind of battery such as a cylindrically shaped battery.

Additionally, the shaft 16 can be formed on the extending tabs 42 of the bracket 30, while the shaft hole 46 can be defined in the protrusions 12 of the base 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A mounting apparatus for mounting a battery, comprising:

a base, two electric terminals extending from the base and electrically connected to a circuit board; and a bracket configured for receiving the battery, wherein the bracket is rotatably mounted to the base; the bracket comprises a positive conductive tab and a negative conductive tab formed on sidewalls of the bracket to clamp with electrical contact an anode and a cathode of the battery respectively once the battery is inserted into the bracket; the positive and negative conductive tabs are always electrically connected to the two electric terminals via wires respectively during the rotation of the bracket, such that the battery can be arranged at any angle relative to the circuit board to satisfy different demands of layout of the circuit board;

wherein the bracket defines two shaft holes on two opposite side walls, the base comprises two shafts to rotatably engage in the two shaft holes;

wherein two extending tabs protrude from two opposite ends of the bracket, with an accommodating space defined between the extending tabs, a protrusion protrudes from the ends of the base to be accommodated in the accommodating space;

wherein the two extending tabs, each having each shaft hole to engage rotatably on the two shafts of the base;

wherein each of the shafts includes two spaced substantially semicircular-shaped projecting parts, the projecting parts of each of the shafts are squeezed toward each other to rotatably engage in the corresponding shaft hole;

wherein the protrusion comprises a cavity to retain the positive conductive tab.

2. The mounting apparatus of claim 1, wherein the two spaced substantially semicircular-shaped projecting parts forming a slot to release a stress on the two spaced substantially semicircular-shaped projecting parts.

3. The mounting apparatus of claim 1, wherein the bracket defines a receiving space confined by the sidewalls thereof, configured for receiving the battery.

4. The mounting apparatus of claim 3, wherein the positive conductive tab and the negative conductive tab are extended into the receiving space, configured for electrically connecting the anode and cathode of the battery.

5. The mounting apparatus of claim 4, wherein the bracket defines a through hole in the sidewalls for communicating with the receiving space, the negative conductive tab passes through the through hole to enter into the receiving space.

6. A printed circuit board (PCB) comprising:
a PCB body;
a battery;
a base mounted to the PCB body, two electric terminals extending from the base and electrically connected to the PCB body; and
a bracket for receiving the battery, wherein the bracket is rotatably mounted to the base; the bracket comprises a positive electrical contact and a negative electrical contact formed on sidewalls of the bracket to clamp with electrical contact an anode and a cathode of the battery respectively when the battery is inserted into the bracket; the positive and negative electrical contacts are always electrically connected to the two electric terminals via wires respectively during the rotation of the bracket, such that the battery can be arranged at any angle relative to the PCB body to satisfy different demands of layout of the PCB body;

wherein the bracket defines two shaft holes on two opposite side walls, the base comprises two shafts to rotatably engage in the two shaft holes;

wherein two extending tabs protrude from two opposite ends of the bracket, with an accommodating space defined between the extending tabs, a protrusion protrudes from the ends of the base to be accommodated in the accommodating space;

wherein the two extending tabs, each having each shaft hole to engage rotatably on the two shafts of the base;

wherein each of the shafts includes two spaced substantially semicircular-shaped projecting parts, the projecting parts of each of the shafts are squeezed toward each other to rotatably engage in the corresponding shaft hole;

wherein the protrusion comprises a cavity to retain the positive conductive tab.

7. The PCB of claim 6, wherein two posts extend from a bottom of the base, to engage with the PCB body.

8. The PCB 6, wherein the two spaced substantially semicircular-shaped projecting parts forming a slot to release a stress on the two spaced substantially semicircular-shaped projecting parts.

9. The PCB of claim 6, wherein the bracket defines a receiving space confined by the sidewalls thereof, for receiving the battery.

10. The PCB of claim 9, wherein the positive electrical contact and the negative electrical contact are extended into the receiving space, for electrically connecting the anode and cathode of the battery.

11. The PCB of claim 10, wherein the two electric terminals extend from a bottom of the base to be and are electrically connected to the PCB body via welding.

12. The PCB of claim 10, wherein the bracket defines a through hole in the sidewalls for communicating with the receiving space, and for the negative electrical contact passing therethrough to enter into the receiving space.

13. The PCB of claim 12, wherein the receiving space comprises a bottom wall for supporting the battery, the bottom wall and the positive electrical contact are sandwiching the battery therebetween.

* * * * *